(12) United States Patent
Kim et al.

(10) Patent No.: US 10,693,091 B2
(45) Date of Patent: Jun. 23, 2020

(54) DISPLAY APPARATUS

(71) Applicant: Samsung Display Co., Ltd., Yongin-si, Gyeonggi-do (KR)

(72) Inventors: Woongsik Kim, Yongin-si (KR); Junhyeong Park, Yongin-si (KR); Minwoo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/175,740

(22) Filed: Oct. 30, 2018

(65) Prior Publication Data

US 2019/0198782 A1   Jun. 27, 2019

(30) Foreign Application Priority Data

Dec. 26, 2017  (KR) .................. 10-2017-0180120

(51) Int. Cl.
*H01L 51/00* (2006.01)
*H01L 51/52* (2006.01)
*H01L 27/32* (2006.01)

(52) U.S. Cl.
CPC ...... *H01L 51/0097* (2013.01); *H01L 51/5253* (2013.01); *H01L 51/5256* (2013.01); *H01L 51/5275* (2013.01); *H01L 27/3213* (2013.01); *H01L 27/3244* (2013.01); *H01L 2251/5338* (2013.01)

(58) Field of Classification Search
CPC ............. H01L 51/0097; H01L 51/5256; H01L 51/5275; H01L 51/5253; H01L 2251/5338; H01L 27/3244
See application file for complete search history.

(56) References Cited

U.S. PATENT DOCUMENTS

| 6,072,450 A | 6/2000 | Yamada et al. |
| 7,535,646 B2 | 5/2009 | Chari et al. |

(Continued)

FOREIGN PATENT DOCUMENTS

| KR | 10-0909268 B1 | 8/2009 |
| KR | 10-2014-0143916 A | 12/2014 |

(Continued)

*Primary Examiner* — Hsien Ming Lee
(74) *Attorney, Agent, or Firm* — Lewis Roca Rothgerber Christie LLP

(57) ABSTRACT

A display apparatus includes a base layer including device counterparts and bridges, the bridges being located around the device counterparts and connecting the device counterparts to each other, an inorganic insulating layer located over the base layer and having openings exposing at least a portion of at least one of the bridges, organic layers filling the openings, wires located over the organic layers, display devices located over the device counterparts, and encapsulation films each of which has a form of an island to correspond to a corresponding one of the device counterparts, each of the encapsulation films including a first inorganic encapsulation film covering a corresponding one of the display devices, an organic encapsulation film located over the first inorganic encapsulation film, and a second inorganic encapsulation film covering the organic encapsulation film and contacting the first inorganic encapsulation film outside of the organic encapsulation film.

15 Claims, 12 Drawing Sheets

(56) References Cited

U.S. PATENT DOCUMENTS

| | | |
|---|---|---|
| 7,621,794 B2 | 11/2009 | Lee et al. |
| 9,142,802 B2 | 9/2015 | Miyamoto et al. |
| 9,331,309 B2 | 5/2016 | Kudo et al. |
| 10,461,142 B2 * | 10/2019 | Hong .................. H01L 51/5253 |
| 2003/0064171 A1 | 4/2003 | Burrows et al. |
| 2003/0203210 A1 | 10/2003 | Graff et al. |
| 2009/0208754 A1 | 8/2009 | Chu et al. |
| 2012/0098026 A1 | 4/2012 | Kwack et al. |
| 2014/0361264 A1 | 12/2014 | Choi et al. |
| 2016/0005999 A1 | 1/2016 | Lee et al. |
| 2016/0126496 A1 | 5/2016 | Wang et al. |
| 2018/0012940 A1 | 1/2018 | Park et al. |
| 2018/0114825 A1 * | 4/2018 | Hong .................. H01L 27/326 |

FOREIGN PATENT DOCUMENTS

| | | |
|---|---|---|
| KR | 10-2016-0053356 A | 5/2016 |
| KR | 10-1676901 B1 | 11/2016 |
| KR | 10-2008-0081717 A | 9/2017 |
| KR | 10-2018-0005323 A | 1/2018 |

* cited by examiner

DISPLAY APPARATUS

CROSS-REFERENCE TO RELATED APPLICATION

This application claims priority to and the benefit of Korean Patent Application No. 10-2017-0180120, filed on Dec. 26, 2017, in the Korean Intellectual Property Office, the disclosure of which is incorporated herein in its entirety by reference.

BACKGROUND

1. Field

Aspects of the present disclosure relate to display apparatuses.

2. Description of the Related Art

Generally, a display apparatus includes a display unit provided on a substrate. At least a portion of the display apparatus may be configured to be foldable or stretchable such that the display apparatus is transformed to have various shapes while being used.

However, in a general display apparatus according to the related art, a defect may occur in a display device or in a wire connected to the display device due to folding or stretching.

SUMMARY

Aspects of embodiments of the present disclosure are directed to a display apparatus in which a display device is prevented from being damaged despite transformation of a substrate, and light efficiency is increased.

Additional aspects will be set forth in part in the description which follows and, in part, will be apparent from the description, or may be learned by practice of the presented embodiments.

According to one or more embodiments of the present disclosure, there is provided a display apparatus including: a base layer including device counterparts and bridges, the bridges being located around the device counterparts and connecting the device counterparts to each other; an inorganic insulating layer located over the base layer and having openings exposing at least a portion of at least one of the bridges; organic layers filling the openings; wires located over the organic layers; display devices located over the device counterparts; and encapsulation films each of which has a form of an island to correspond to a corresponding one of the device counterparts, each of the encapsulation films including: a first inorganic encapsulation film covering a corresponding one of the display devices; an organic encapsulation film located over the first inorganic encapsulation film; and a second inorganic encapsulation film covering the organic encapsulation film and contacting the first inorganic encapsulation film outside of the organic encapsulation film.

In some embodiments, at least a portion of the organic encapsulation film has a convex lens shape.

In some embodiments, a surface of the first inorganic encapsulation film facing the organic encapsulation film is more hydrophobic than a surface of the second inorganic encapsulation film facing away from the first inorganic encapsulation film.

In some embodiments, the display apparatus further includes a hydrophobic coating layer arranged between the first inorganic encapsulation film and the organic encapsulation film.

In some embodiments, each of the device counterparts has a quadrangular shape, and a corresponding one of the bridges is connected to each side of each of the device counterparts.

In some embodiments, each of the bridges has a curved portion and the curved portion is adjacent to a corresponding one of the device counterparts.

In some embodiments, the curved portion has a uniform radius of curvature.

In some embodiments, the base layer further includes peripheral regions connected to an edge of the device counterparts, and slits formed between the peripheral regions and the bridges.

In some embodiments, each of the slits includes a curved portion.

In some embodiments, the display apparatus further includes thin-film transistors located over the device counterparts and electrically connected to the display devices, wherein the wires include a same material as a material included in source electrodes and drain electrodes of the thin-film transistors.

In some embodiments, the organic layers cover an edge of the inorganic insulating layer.

According to one or more embodiments of the present disclosure, there is provided a display apparatus including: a base layer including device counterparts and bridges, the bridges being located around the device counterparts and connecting the device counterparts to each other; an inorganic insulating layer located over the base layer and having openings exposing at least a portion of at least one of the bridges; organic layers filling the openings; wires located over the organic layers; display device sets located over a corresponding one of the device counterparts, wherein each of the display device sets includes a plurality of display devices; and encapsulation films each of which has a form of an island to correspond to a corresponding one of the device counterparts, each of the encapsulation films including: a first inorganic encapsulation film covering a corresponding one of the display devices; an organic encapsulation film located over the first inorganic encapsulation film; and a second inorganic encapsulation film covering the organic encapsulation film and contacting the first inorganic encapsulation film outside of the organic encapsulation film.

In some embodiments, each of the plurality of display devices includes an organic light-emitting device including: a pixel electrode; an intermediate layer located over the pixel electrode and including an emission layer; and an opposite electrode located over the intermediate layer, and in the plurality of devices included in one of the display device sets, opposite electrodes are integrated with one another to form a single opposite electrode having a form of an island corresponding to a corresponding one of the device counterparts.

In some embodiments, the opposite electrode is connected to at least one of the wires.

In some embodiments, the organic encapsulation film of each of the encapsulation films corresponds to corresponding one of the display device sets.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
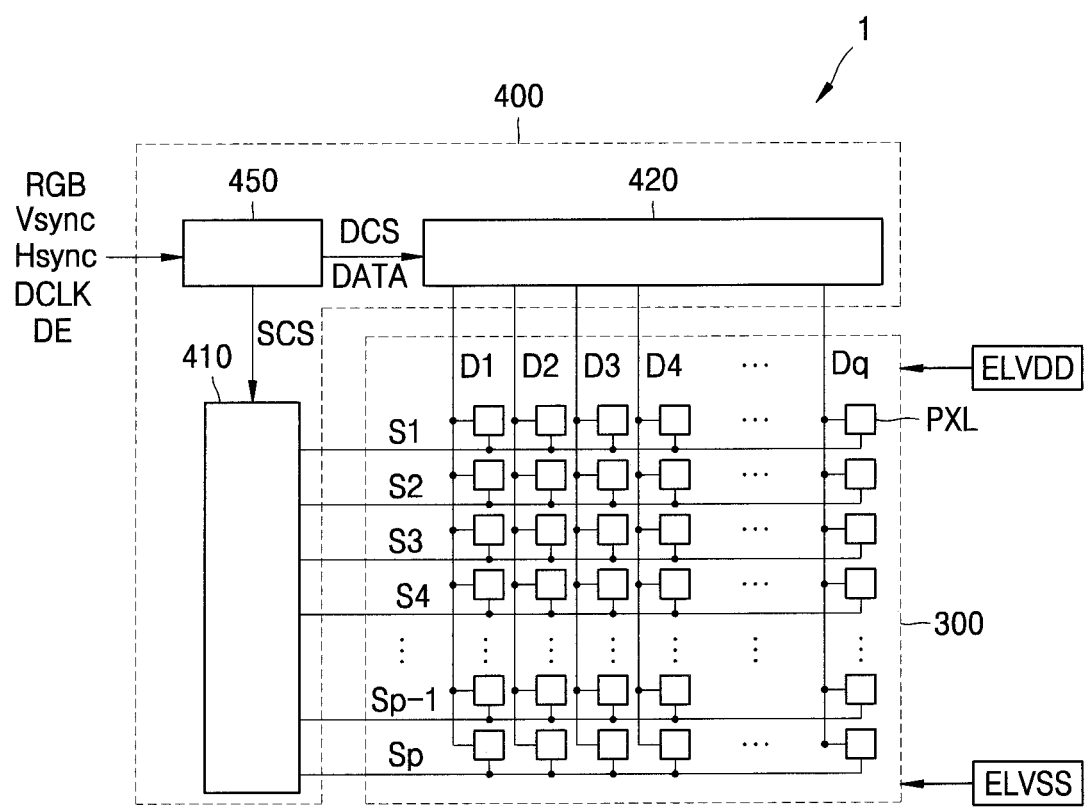
FIG. 1 is a block diagram of an organic light-emitting display apparatus according to an exemplary embodiment of the present disclosure.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

In drawings, like reference numerals refer to like elements throughout and overlapping descriptions shall not be repeated.

Figure 2:
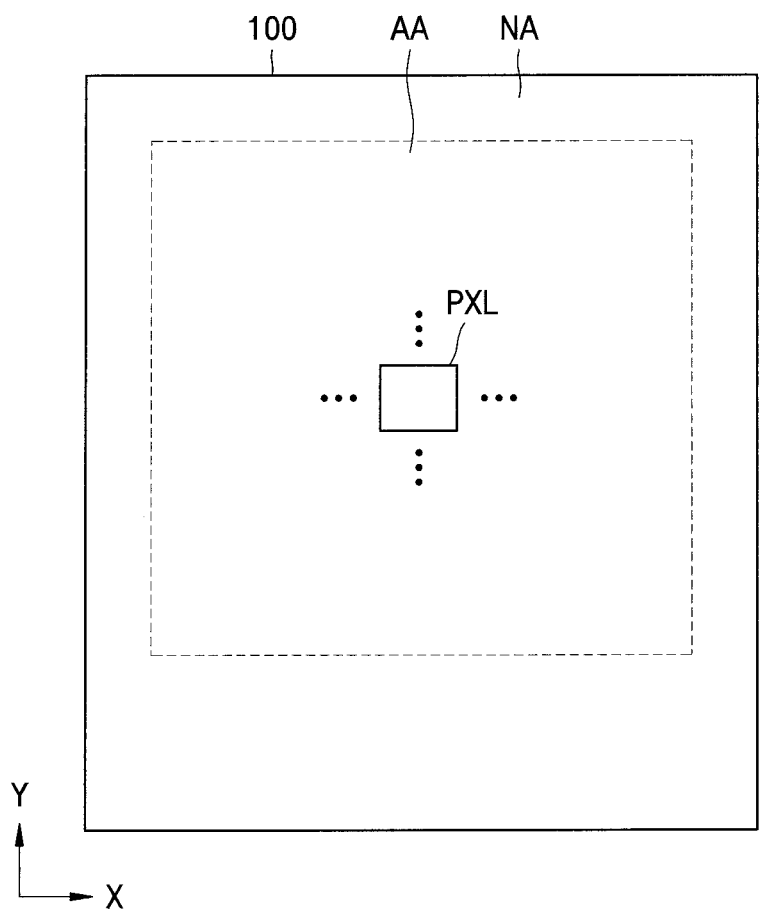
FIG. 2 is a plan view of a substrate included in the organic light-emitting display apparatus of FIG. 1.

FIG. 1 is a block diagram of an organic light-emitting display apparatus 1 according to an exemplary embodiment of the present disclosure. FIG. 2 is a plan view of a substrate 100 included in the organic light-emitting display apparatus 1 of FIG. 1.

As shown in FIG. 1, the organic light-emitting display apparatus 1 according to the current embodiment may include a display unit (e.g., a display) 300 and a driving unit (e.g., a driver) 400.

The display unit 300 may include pixels PXL, and data lines D1 to Dq and scan lines S1 to Sp connected to the pixels PXL. The pixels PXL may be pixels of a general meaning or may be sub-pixels in the current embodiment, and also in the following embodiments and modifications thereof. Data signals and scan signals may be applied to the pixels PXL through the data lines D1 to Dq and the scan lines S1 to Sp. The pixels PXL may be electrically connected to a power supply line ELVDD or an electrode power supply line ELVSS. For example, each of the pixels PXL may include an organic light-emitting device (OLED), and may generate light corresponding to the a data signal applied by a corresponding one of the data lines D1 to Dq according to a current flowing from the power supply line ELVDD to the electrode power supply line ELVSS through the OLED.

The driving unit 400 may include a scan driver 410, a data driver 420, and a timing controller 450.

The scan driver 410 may apply the scan signals to the scan lines S1 to Sp according to a scan driver control signal SCS. For example, the scan driver 410 may apply the scan signals sequentially to the scan lines S1 to Sp. The scan driver 410 may be directly formed over the substrate 100 where the pixels PXL are formed, may be directly mounted on the substrate 100, or may be connected to the substrate 100 through a separate element, such as a flexible printed circuit board.

The data driver 420 may generate a data signal by receiving a data driver control signal DCS and image data DATA from the timing controller 450. The data driver 420 may apply the data signals generated as such to the data lines D1 to Dq. The data driver 420 may be directly formed over the substrate 100 where the pixels PXL are formed, may be directly mounted on the substrate 100, or may be connected to the substrate 100 through a separate element, such as a flexible printed circuit board.

When a scan signal is applied to a scan line, data signals transmitted from the data lines D1 to Dq may be applied to the pixels PXL connected to the scan line, and accordingly, the pixels PXL may emit light at luminance corresponding to the applied data signals.

The timing controller 450 may generate control signals for controlling the scan driver 410 and the data driver 420. For example, the control signals may include the scan driver control signal SCS for controlling the scan driver 410, and the data driver control signal DCS for controlling the data driver 420. Here, the timing controller 450 may generate the scan driver control signal SCS and the data driver control signal DCS by using an external input signal. For example, the external input signal may include a dot clock signal DCLK, a data enable signal DE, a vertical synchronization signal Vsync, and/or a horizontal synchronization signal Hsync.

Also, the timing controller 450 may apply the scan driver control signal SCS to the scan driver 410, and apply the data driver control signal DCS to the data driver 420. The timing controller 450 may convert image data RGB input from an external source into the image data DATA that conforms to the specification of the data driver 420, and apply the image data DATA to the data driver 420. The data enable signal DE may be a signal that defines a period of time during which valid data is input, wherein one cycle may be set to one horizontal period of time of the horizontal synchronization signal Hsync.

In FIG. 1, the scan driver 410, the data driver 420, and the timing controller 450 are illustrated as separate components, however, at least some of the components may be integrated as desired. Also, the scan driver 410, the data driver 420, and the timing controller 450 may be provided in any one of various suitable manners, such as chip on glass, chip on plastic, tape carrier package, and chip on film.

Such various components may be arranged over the substrate 100 that is shown in FIG. 2. The substrate 100 may include an active area where an image may be displayed, and a non-active area NA around the active area AA. The pixels PXL are located in the active area AA, and the components, such as the driving unit 400, for controlling the pixels PXL may be located in the non-active area NA. The non-active area NA may be understood as a non-display area.

The substrate 100 is stretchable, and thus may be stretched or contracted in one or more directions, or may be flexible. The substrate 100 may include various suitable materials having flexible, bendable, or stretchable characteristics, and for example, may include a polymer resin, such as polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), and/or the like. A configuration of the substrate 100 may vary in a suitable manner. For example, the substrate 100 may have a multilayer structure including two layers, which include polymer resin, and a barrier layer, which includes an inorganic material (e.g., silicon oxide, silicon nitride, silicon oxynitride, and/or the like), provided between the two layers.

Figure 3:
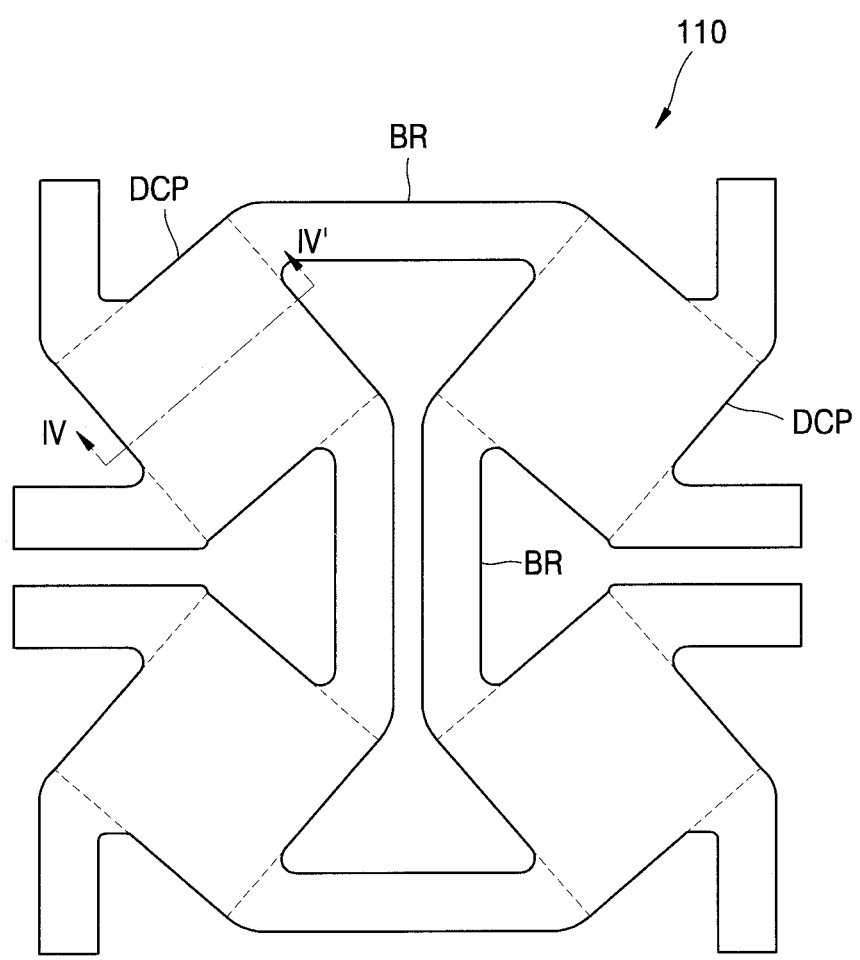
FIG. 3 is a plan view of a base layer included in the organic light-emitting display apparatus of FIG. 1.

FIG. 3 is a plan view of the base layer 110, which may be located over the substrate 100. The base layer 110 is arranged over the substrate 100, and includes device counterparts DCP and bridges BR. The device counterparts DCP are portions of the base layer 110 over which display devices will be located. Each of the device counterparts DCP may be in the form of an island. Bridges BR are located around the device counterparts DCP and connect the device counterparts DCP to each other.

The device counterparts DCP may be regularly arranged along a first axis (X-axis) and a second axis (Y-axis) crossing the first axis. Also, the adjacent device counterparts DCP may be connected to each other through at least one bridge BR. FIG. 3 only illustrates a portion of the base layer 110, and a plurality of such portions may be regularly arranged along the first axis and the second axis. The same is applied to the following embodiments and modifications thereof. Display devices, such as OLEDs, may be located above each of the device counterparts DCP; and wires transmitting power, electrode power, a scan signal, and/or a data signal, which are to be applied to the display devices, may be located over the bridges BR.

When the substrate 100 is stretched, a distance (e.g., an interval) between the device counterparts DCP may be increased or decreased. However, even when the distance (e.g., interval) between the device counterparts DCP changes, a shape of each of the device counterparts DCP is not transformed or the amount of transformation of the shape may be reduced. Accordingly, the display devices located over the device counterparts DCP may also not be transformed or the amount of transformation thereof may be reduced. Of course, when the substrate 100 is stretched, the bridges BR connecting the device counterparts DCP may be partially transformed. However, because the wires located over the bridges BR include a flexible metal material, the wires may not be damaged despite the transformation.

The base layer 110 may be formed of a flexible material such that the bridges BR are not damaged even when the bridges BR are transformed. For example, the base layer 110 may include a polymer resin, such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), and/or the like.

In FIG. 3, each of the device counterparts DCP has an approximate quadrangular shape, but is not limited thereto, and shapes of the device counterparts DCP may suitably vary. Also, shapes of the bridges BR connecting the device counterparts DCP are not limited to those shown in FIG. 3, and may suitably vary.

Figure 4:
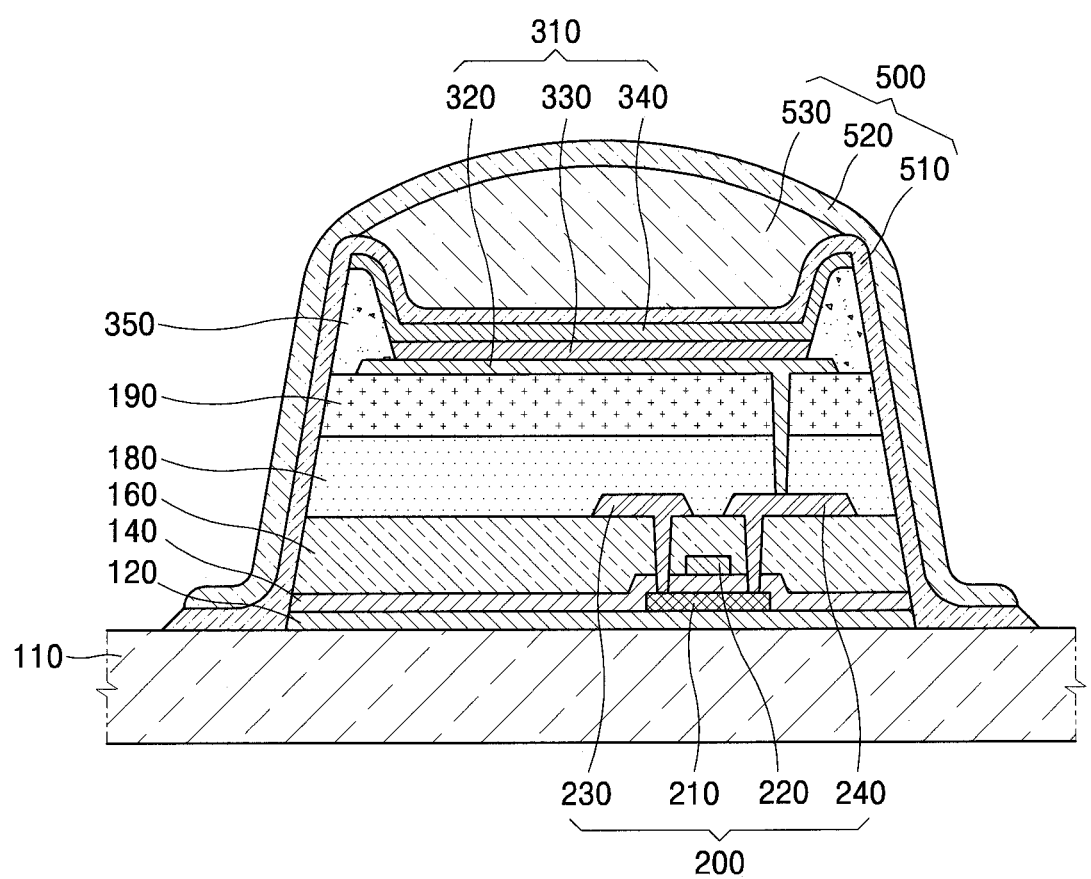
FIG. 4 is a cross-sectional view of a portion of the organic light-emitting display apparatus of FIG. 1, taken along the line IV-IV' of FIG. 3.

FIG. 4 is a cross-sectional view of a portion of the organic light-emitting display apparatus 1 of FIG. 1, taken along the line IV-IV' of FIG. 3. For example, FIG. 4 is a cross-sectional view illustrating an organic light-emitting device as a display device 310 and an underlying structure located over the device counterpart DCP of the base layer 110 over a substrate, and is a cross-sectional view taken along the line VI-VI' of FIG. 3. In addition to the display device 310, a thin-film transistor (TFT) 200 electrically connected to the display device 310 may be located over the device counterpart DCP as shown in FIG. 4. In FIG. 4, an OLED is located over the base layer 110, as the display device 310. The OLED being electrically connected to the TFT 200 may mean that a pixel electrode 320 of the OLED is electrically connected to the TFT 200.

The TFT 200 may include a semiconductor layer 210, a gate electrode 220, a source electrode 230, and a drain electrode 240, which include amorphous silicon, polycrystalline silicon, or an organic semiconductor material. In order to obtain insulation between the semiconductor layer 210 and the gate electrode 220, a gate insulating layer 140 including an inorganic material, such as silicon oxide, silicon nitride, and/or silicon oxynitride, may be provided between the semiconductor layer 210 and the gate electrode 220. In addition, an interlayer insulating layer 160 including an inorganic material, such as silicon oxide, silicon nitride, silicon oxynitride, and/or the like, may be arranged over the gate electrode 220, and the source and drain electrodes 230 and 240 may be arranged over the interlayer insulating layer 160. The gate insulating layer 140 and the interlayer insulating layer 160 including the insulating material may be formed via a chemical vapor deposition (CVD) or atomic layer deposition (ALD) method. This is also applied to the following embodiments and modifications thereof.

A buffer layer 120 including an inorganic material, such as silicon oxide, silicon nitride, and/or silicon oxynitride, may be provided between the TFT 200 and the base layer 110. The buffer layer 120 may increase flatness of a top surface of the base layer 110 or may prevent or limit impurities from penetrating into the semiconductor layer 210 of the TFT 200 from the base layer 110 or the substrate below the base layer 110. The buffer layer 120, the gate insulating layer 140, and/or the interlayer insulating layer 160 may be commonly referred to as an inorganic insulating layer. This is also applied to the following embodiments and modifications thereof.

A passivation layer 180 may be located over the TFT 200. The passivation layer 180 may be an inorganic insulating layer including an inorganic material. The inorganic material for forming the passivation layer 180 may be silicon oxide, silicon nitride, silicon oxynitride, polysiloxane, and/or the like. Unlike that shown in FIG. 4, the passivation layer 180 may have a curved top surface corresponding to a shape of a top surface of a structure below the passivation layer 180. When desired, the passivation layer 180 may be omitted.

A planarization layer 190 may be arranged over the passivation layer 180. For example, as shown in FIG. 4, when the display device 310 is arranged over the TFT 200, the planarization layer 190 may substantially flatten the top surface of the TFT 200. The planarization layer 190 may be formed of an organic material, such as acryl, benzocyclobutene (BCB), hexamethyldisiloxane (HMDSO), and/or the like. The planarization layer 190 is a single layer in FIG. 4, but may be variously modified in a suitable manner, and, for example, may include multiple layer.

The display device 310 may be arranged over the planarization layer 190. The display device 310 may be an OLED including, for example, the pixel electrode 320, an opposite electrode 340, and an intermediate layer 330, which may include an emission layer and be provided between the pixel and opposite electrodes 320 and 340. The pixel electrode 320 may be electrically connected to the TFT 200 by contacting any one of the source and drain electrodes 230 and 240 through a contact hole (i.e., a contact opening) formed in the planarization layer 190, as shown in FIG. 4.

A pixel defining layer 350 may be arranged over the planarization layer 190. The pixel defining layer 350 may define a pixel by including an opening corresponding to each sub-pixel, that is, an opening exposing at least a center portion of the pixel electrode 320. Also, in FIG. 4, the pixel defining layer 350 increases a distance between an edge of the pixel electrode 320 and an edge of the opposite electrode 340 over the pixel electrode 320 so as to prevent an arc from occurring, or reduce instances thereof, at the edge of the pixel electrode 320. Such a pixel defining layer 350 may be formed of an organic material, such as PI, HMDSO, and/or the like.

The pixel electrode 320 may include a transparent conductive material, such as indium tin oxide (ITO), indium zinc oxide (IZO), zinc oxide (ZnO), indium oxide (In$_2$O$_3$), or the like, and/or a reflective metal, such as lithium (Li), calcium (Ca), lithium fluoride/calcium (LiF/C), lithium fluoride/aluminum (LiF/Al), Al, silver A(g), magnesium (mg), gold (Au), or the like.

The intermediate layer 330 of the display device 310 may include a low molecular weight or high molecular weight material. When the intermediate layer 330 includes a low molecular weight material, the intermediate layer 330 may have a structure in which a hole injection layer (HIL), a hole transport layer (HTL), an emission layer (EML), an electron transport layer (ETL), and an electron injection layer (EIL) are stacked in a single or complex structure, and may be formed via a vacuum deposition method. When the intermediate layer 330 includes a high molecular weight material, the intermediate layer 330 may include an HTL and an EML. Here, the HTL may include polyethylene dioxythiophene (PEDOT), and/or the like, and the EML may include a polyphenylenevinylene (PPV)-based or polyfluorene-based high molecular weight material, and/or the like. The intermediate layer 330 may be formed via a screen printing or inkjet printing method or a laser induced thermal imaging (LITI) method. However, the intermediate layer 330 is not limited thereto, and may have any one of various structures.

The opposite electrode 340 is arranged over the intermediate layer 330. The opposite electrode 340 may include a metal film formed of Ag, Mg, Al, Pt, Pd, Au, Ni, Nd, Ir, Cr, and/or the like; and/or a transparent conductive film formed of ITO, IZO, ZnO, indium tin zinc oxide (ITZO), and/or the like.

Because the display device 310 may be easily damaged by external moisture or oxygen, an encapsulation film 500 may cover the display device 310 to protect the display device 310. As shown in FIG. 4, the encapsulation film 500 may include a first inorganic encapsulation film 510, an organic encapsulation film 530, and a second inorganic encapsulation film 520. In particular, the encapsulation film 500 may be in the form of an island (when viewed from a plan view) to correspond to the device counterpart DCP. Accordingly, the organic light-emitting display apparatus 1 may include a plurality of the encapsulation films 500 spaced apart from each other.

The first inorganic encapsulation film 510 may cover the opposite electrode 340 and include silicon oxide, silicon nitride, silicon oxynitride, and/or the like. When desired, other layers, such as a capping layer, may be provided between the first inorganic encapsulation film 510 and the opposite electrode 340. Because the first inorganic encapsulation film 510 is formed along a structure therebelow, a top surface of the first inorganic encapsulation film 510 is not flat as shown in FIG. 4.

The organic encapsulation film 530 is located over the first inorganic encapsulation film 510, and unlike the first inorganic encapsulation film 510, a top surface of the organic encapsulation film 530 may be formed to have a flat or uniform shape. In particular, as shown in FIG. 4, at least a portion of the organic encapsulation film 530 may have a convex shape such that condensing efficiency of light emitted from the display device 310 is increased. The organic encapsulation film 530 may include at least one material selected from PET, PEN, PC, PI, polyethylene sulfonate, polyoxymethylene, PAR, and HMDSO.

An inkjet printing method may be used to form the organic encapsulation film 530. For example, the organic encapsulation film 530 may be simply formed by dotting a monomer material over the first inorganic encapsulation film 510 over the opposite electrode 340 by using the inkjet printing method, and then hardening the monomer material. At this time, to prevent or substantially prevent the dotted monomer material from spreading and to maintain a lens shape during the inkjet printing method, the top surface of the first inorganic encapsulation film 510 may be hydrophobized via a plasma process or the like before the inkjet printing method. Accordingly, a contact angle of the dotted monomer material at the first inorganic encapsulation film 510 may be about 30° to about 50°. In this case, a surface of the first inorganic encapsulation film 510 facing the organic encapsulation film 530 may be more hydrophobic than a surface of the second inorganic encapsulation film 520 facing away from the first inorganic encapsulation film 510. In some examples, a coating layer may be formed over the first inorganic encapsulation film 510 by using a hydrophobic material, and then a material for forming the organic encapsulation film 530 may be dotted over the coating layer via the inkjet printing method.

The second inorganic encapsulation film 520 may cover the organic encapsulation film 530, and may include silicon oxide, silicon nitride, silicon oxynitride, and/or the like. The second inorganic encapsulation film 520 may contact the first inorganic encapsulation film 510 from outside of the organic encapsulation film 530 such that the organic encapsulation film 530 is not externally exposed.

As such, the encapsulation film 500 includes the first inorganic encapsulation film 510, the organic encapsulation film 530, and the second inorganic encapsulation film 520, and external impurities, such as moisture or oxygen, may be prevented or substantially prevented from penetrating into the display device 310 through such a multilayer structure.

The light-emitting display apparatus 1 may have different cross sections based on where it is viewed from; however, various layers over the device counterpart DCP of the base layer 110 may not extend out of the device counterpart DCP except for the bridges BR. Accordingly, in FIG. 4, the buffer layer 120, the gate insulating layer 140, the interlayer insulating layer 160, the passivation layer 180, and the planarization layer 190 have side surfaces. Also, the first inorganic encapsulation film 510 of the encapsulation film 500 cover such side surfaces. When desired, the second inorganic encapsulation film 520 may also cover the side surfaces as shown in FIG. 4. Accordingly, impurities may be effectively prevented from penetrating into the display device 310 through the side surfaces of the buffer layer 120, the gate insulating layer 140, the interlayer insulating layer 160, the passivation layer 180, and/or the planarization layer 190. The buffer layer 120 the gate insulating layer 140, the interlayer insulating layer 160, the passivation layer 180, and/or the planarization layer 190 may be continuously connected with respect to the adjacent device counterparts DCP through the bridges BR.

Figure 5:
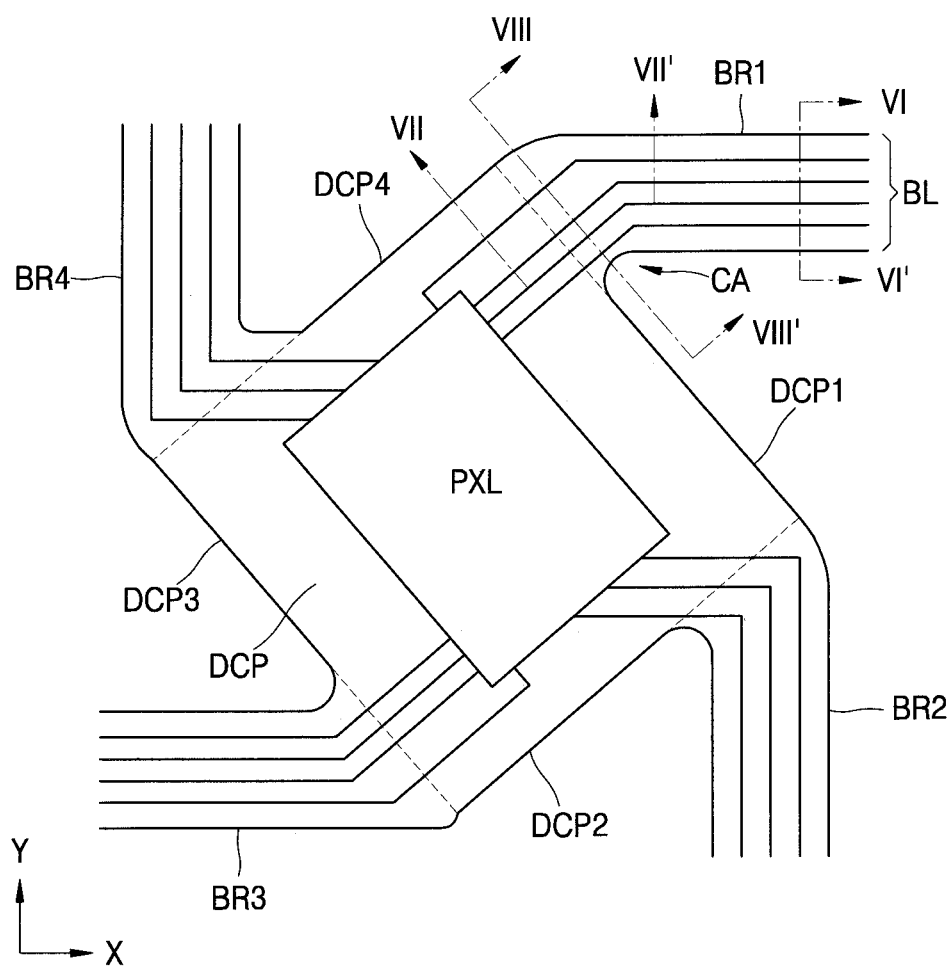
FIG. 5 is a plan view of a device counterpart, that is, a portion of the base layer of FIG. 3, and portions of bridges connected to the device counterpart.

FIG. 5 is a plan view of the device counterpart DCP, that is, a portion of the base layer 110 of FIG. 3, and portions of first through fourth bridges BR1 through BR4 connected to the device counterpart DCP. As shown in FIG. 5, from the plan view, the device counterpart DCP may have an approximate quadrangular shape having first through fourth sides DCP1 through DCP4. A display device, such as an OLED, described with reference to FIG. 4 may be arranged over the device counterpart DCP. One sub-pixel may be arranged in one device counterpart DCP, or a plurality of sub-pixels forming one pixel may be arranged in one device counterpart DCP. For example, in the latter case, a red sub-pixel, a blue sub-pixel, and a green sub-pixel may be arranged together in one device counterpart DCP.

Bridges may be connected to sides of the device counterpart DCP, which may be portions indicated as external edges on a plan view. For example, as shown in FIG. 5, the first through fourth bridges BR1 through BR4 may be respectively connected to the first through fourth sides DCP1 through DCP4 of the device counterpart DCP. The first bridge BR1 may be connected to a portion of the first side DCP1, and extend in a first direction (+X direction). The first bridge BR1 may have a curved portion CA at a region connected to the first side DCP1, that is, adjacent to the device counterpart DCP. The second bridge BR2 may be connected to a portion of the second side DCP2, and extend in a second direction (−Y direction). The second bridge BR2 may have a curved portion CA at a region connected to the second side DCP2, that is, adjacent to the device counterpart DCP. The third bridge BR3 may be connected to a portion of the third side DCP3, and extend in an opposite direction (−X direction) of the first direction. The third bridge BR3 may have a curved portion CA at a region connected to the third side DCP3, that is, adjacent to the device counterpart DCP. The fourth bridge BR4 may be connected to a portion of the fourth side DCP4, and extend in an opposite direction (+Y direction) of the second direction. The fourth bridge BR4 may have a curved portion CA at a region connected to the fourth side DCP4, that is, adjacent to the device counterpart DCP.

Wires BL transmitting power, electrode power, a scan signal, and/or a data signal to be applied to the pixel PXL arranged over the device counterpart DCP may be provided in the first through fourth bridges BR1 through BR4. The number of wires BL provided in the first through fourth bridges BR1 through BR4 may vary based on the number of display devices arranged over the device counterpart DCP, and may also vary based on the number of TFTs connected to the display device. Also, the number of wires BL arranged over the first through fourth bridges BR1 through BR4 may be the same or different in the first through fourth bridges BR1 through BR4.

Figure 6:
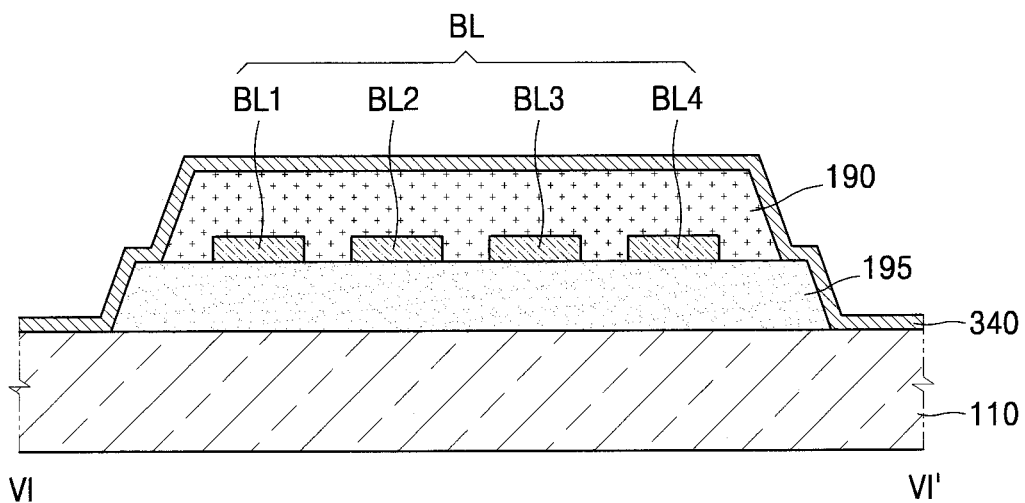
FIG. 6 is a cross-sectional view taken along the line VI-VI' of FIG. 5.
Figure 7:
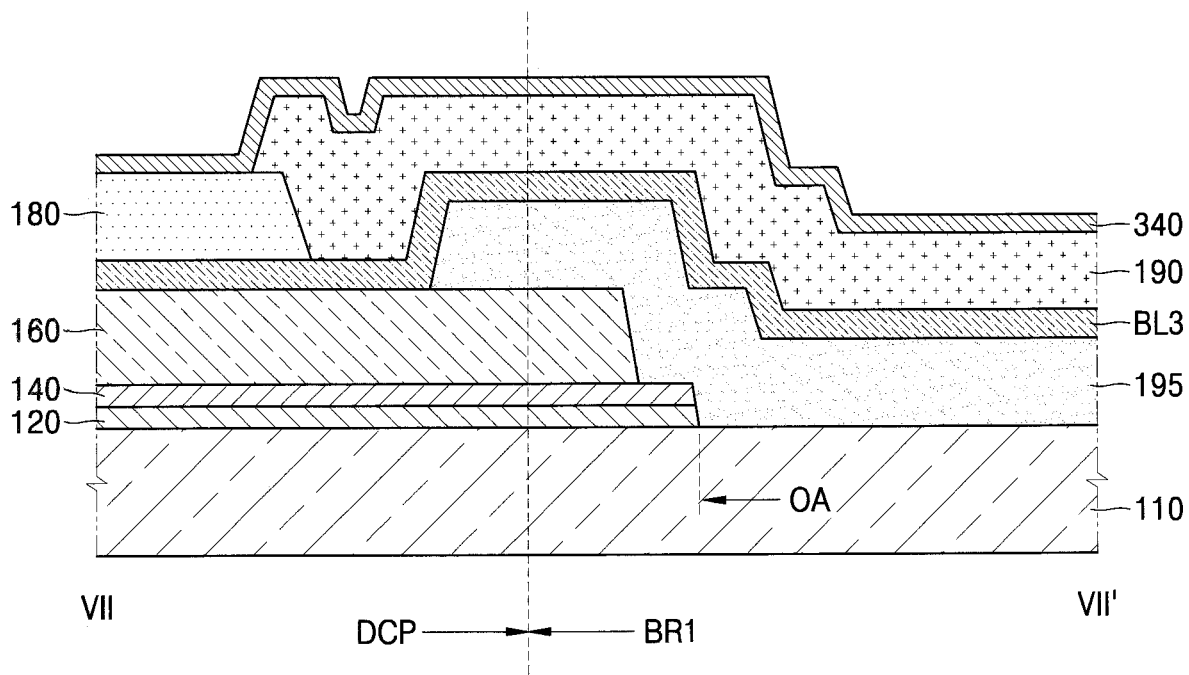
FIG. 7 is a cross-sectional view taken along the line VII-VII' of FIG. 5.
Figure 8:
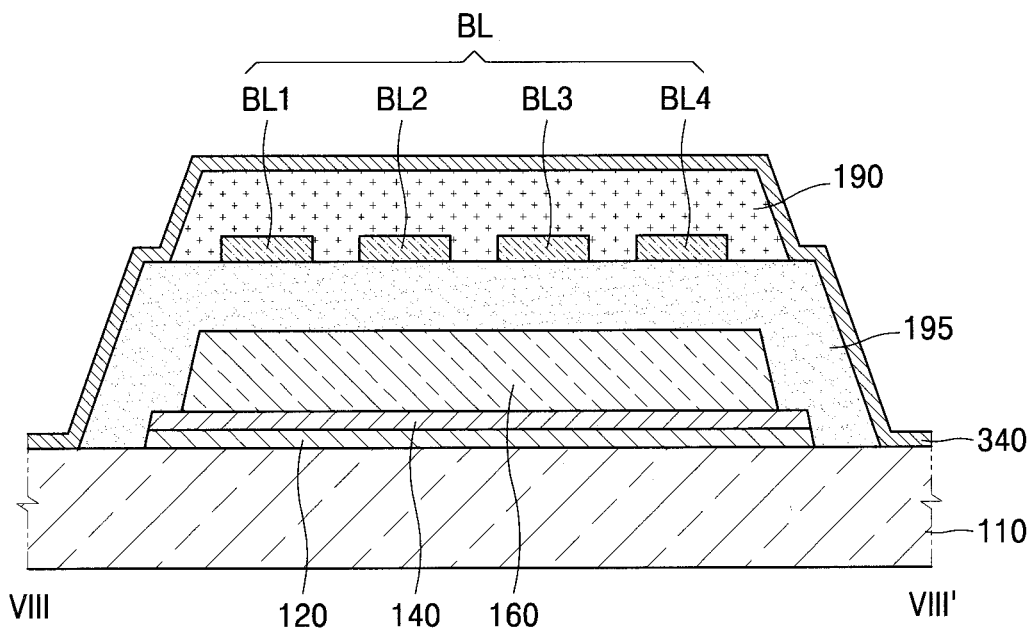
FIG. 8 is a cross-sectional view taken along the line VIII-VIII' of FIG. 5.

FIG. 6 is a cross-sectional view taken along the line VI-VI' of FIG. 5, FIG. 7 is a cross-sectional view taken along the line VII-VII' of FIG. 5, and FIG. 8 is a cross-sectional view taken along the line VIII-VIII' of FIG. 5. Hereinafter, a stacked structure of the wire BL, etc. located over the first bridge BR1 will be described with reference to FIGS. 6 through 8.

As shown in FIG. 7, an inorganic insulating layer located over the base layer 110 includes an opening OA exposing at least a portion of the first bridge BR1, that is, at least one of the first through fourth bridges BR1 through BR4. In FIG. 7, only one opening OA is illustrated because only a portion of the organic light-emitting display apparatus 1 is shown; however, the inorganic insulating layer includes a plurality of the openings OA throughout the organic light-emitting display apparatus 1. Here, as described above, the inorganic insulating layer is a common name of the buffer layer 120, the gate insulating layer 140, and/or the interlayer insulating layer 160. Accordingly, the buffer layer 120, the gate insulating layer 140, and/or the interlayer insulating layer 160 are mainly located at the device counterpart DCP, and only portions of the buffer layer 120, the gate insulating layer 140, and/or the interlayer insulating layer 160 may be located at the first bridge BR1. Also, when an opening of the buffer layer 120, an opening of the gate insulating layer 140, and/or an opening of the interlayer insulating layer 160 have different sizes, it may be understood that a smallest opening defines the opening OA of the inorganic insulating layer.

The organic light-emitting display apparatus 1 according to the current embodiment includes an organic layer 195 and the wires BL. The organic layer 195 fills the opening OA of the inorganic insulating layer. Also, the wires BL are located over such an organic layer 195. Here, the wires BL may be located over the inorganic insulating layer, such as the interlayer insulating layer 160, where the organic layer 195 does not exist. The wires BL may be formed of the same material and at the same time as the source or drain electrode 230 or 240 of the TFT 200 located over the device counterpart DCP.

The organic layer 195 may include any one of various suitable materials having flexible, bendable, or stretchable characteristics, for example, polymer resins such as PES, polyacrylate, PEI, PEN, PET, PPS, PAR, PI, PC, CAP, teflon, benzocyclobutene, and the like.

When the substrate 100 is stretched as described above, the distance (e.g., interval) between the device counterparts DCP may be increased or decreased. However, even when the distance (e.g., interval) between the device counterparts DCP changes, a shape of each of the device counterparts DCP is not transformed or the amount of transformation of the shape may be reduced. Accordingly, the display devices 310 located over the device counterparts DCP may also not be transformed or the amount of transformation thereof may be reduced. Of course, when the substrate 100 is stretched, the bridges BR connecting the device counterparts DCP may be partially transformed. However, because the wires BL located over the bridges BR include a flexible metal material, the wires BL may not be damaged despite the transformation.

In addition, when the inorganic insulating layer, such as the buffer layer 120, the gate insulating layer 140, and/or the interlayer insulating layer 160, does not have the opening OA at the bridge BR and the wires BL are located over such an inorganic insulating layer throughout the bridge BR, a large stress is applied to the wires BL when the substrate 100 is stretched. In particular, because the hardness of the inorganic insulating layer is higher than that of the organic layer 195, the inorganic insulating layer is highly likely to crack at the bridge BR, and when the inorganic insulating layer cracks, the wires BL over the inorganic insulating layer may also crack and thus are highly likely to be defective, for example, become disconnected.

However, in the organic light-emitting display apparatus 1 according to the current embodiment, the inorganic insulating layer includes the opening OA exposing at least a portion of the bridge BR, and the wires BL are located over the organic layer 195 filing the opening OA of the inorganic insulating layer. Because the inorganic insulating layer includes the opening OA at the bridge BR, the inorganic insulating layer hardly cracks, and the organic layer 195 seldom cracks as the organic layer 195 includes an organic material. Accordingly, occurrence of cracks at regions of the wires BL located over the organic layer 195, the regions being located over the bridge BR, may be prevented or reduced. Here, because the hardness of the organic layer 195 is lower than that of the inorganic insulating layer, stress generated by stretching of the substrate 100 may be absorbed by the organic layer 195, and thus stress may be effectively prevented from being focused at the wires BL.

When desired, the wires BL may be formed of a material different from the source or drain electrode 230 or 240 of the TFT 200 located over the device counterpart DCP. For example, the wires BL located over the first bridge BR1 may include a material elongated more than a material of a wire or conductive layer located over the device counterpart DCP such that the wires BL do not become defective, for example, do not become cracked or disconnected, despite transformation of the substrate 100. Also, the wire or conductive layer located over the device counterpart DCP may include a material having excellent electric or mechanical characteristics rather than excellent elongation, such that transmission efficiency of an electric signal is increased or a defect rate during manufacture is decreased. For example, an electrode or conductive layer located over the device counterpart DCP may include molybdenum and/or the like, and the wires BL may include aluminum and/or the like.

The organic layer 195 may cover an edge of the inorganic insulating layer, that is, an inner side of the opening OA of the inorganic insulating layer. Accordingly, the wires BL may not break and may be continuous from the first bridge BR1 to the inorganic insulating layer of the device counterpart DCP. When the organic layer 195 does not cover the inner side of the opening OA of the inorganic insulating layer, a conductive material may not be removed but may remain in the inner side of the opening OA where a stepped portion is formed, while a conductive layer is formed and patterned to form the wires BL. As such, when the conductive material remains, other conductive layers may be short-circuited. Accordingly, occurrence of defect may be blocked or dramatically reduced covering the edge of the inorganic insulating layer, that is, the edge of the opening OA with the organic layer 195.

In FIG. 6, wires BL1 through BL4 are arranged over the organic layer 195. The wires BL1 through BL4 located over the first bridge BR1 extend in a direction that the first bridge BR1 is extending. The wires BL1 through BL4 may extend up to the device counterpart DCP. The wires BL1 through BL4 extending up to the device counterpart DCP may be located over the interlayer insulating layer 160. The wires BL1 through BL4 extending from the first bridge BR1 to the device counterpart DCP may be electrically connected to some of electrodes/wires located over the interlayer insulating layer 160, and may also be electrically connected to some of electrodes/wires located over the gate insulating layer 140. The wires BL1 through BL4 may be, for example, a data line, a scan line, and/or a power line.

The planarization layer 190 may be located over the wires BL1 through BL4. The planarization layer 190 may be integrated with the planarization layer 190 over the device counterpart DCP, and may protect the wires BL1 through BL4 over the first bridge BR1. The planarization layer 190 over the first bridge BR1 may extend up to the device counterpart DCP as shown in FIG. 7, and cover an edge of the passivation layer 180 of the device counterpart DCP. The wires BL1 through BL4 in the device counterpart DCP may be protected by the passivation layer 180.

In the first bridge BR1, the opposite electrode 340 is located over the planarization layer 190. For example, the opposite electrodes 340 may be integrated throughout the plurality of device counterparts DCP. When desired, the opposite electrode 340 may be in the form of an island corresponding to the device counterpart DCP, and the wire BL located over the first bridge BR1 may be connected to the opposite electrode 340 in the form of an island to apply electrode power to the opposite electrode 340.

In addition, as shown in the cross-sectional view of FIG. 8 in a direction perpendicular to an extending direction of the first bridge BR1, the opposite electrode 340 may cover all of side surfaces of the organic layer 195. Accordingly, external impurities may be effectively prevented from penetrating into the organic light-emitting display apparatus 1. When desired, an encapsulation film may also be located over a portion of the opposite electrode 340 at the first bridge BR1.

Structures of the second through fourth bridges BR2 through BR4 may be the same or similar to that of the first bridge BR1 described above. The number of wires BL located over the second through fourth bridges BR2 through BR4 may be the same as, or different from, the number of wires BL located over the first bridge BR1.

As described with reference to FIG. 5, the first through fourth bridges BR1 through BR4 may each have the curved portion CA. The curved portion CA may be adjacent to the device counterpart DCP. The curved portion CA may have a uniform (e.g., constant) or substantially uniform radius of curvature, and indented into the bridge BR. When the substrate 100 is stretched, the bridge BR is transformed, and at this time, a degree of transformation of the bridge BR may vary based on the radius of curvature of the curved portion CA.

When the radius of curvature is about 15 um to about 25 um, a degree of largest transformation of the bridge BR may be low. For example, when the substrate 100 is transformed to a certain degree, the degree of largest transformation of the bridge BR decreases as the radius of curvature increases from about 5 um to about 20 urn, and is increased as the radius of curvature increases from about 20 um to about 35 um. When the degree of transformation of the bridge BR increases, a stress applied to structures including the wires BL located over the bridge BR is increased, and when the degree of transformation of the bridge BR decreases, the stress applied to the structures including the wires BL located over the bridge BR is decreased. Accordingly, the radius of curvature of the curved portion BA included in the bridge BR may be from about 15 um to about 25 um.

Figure 9:
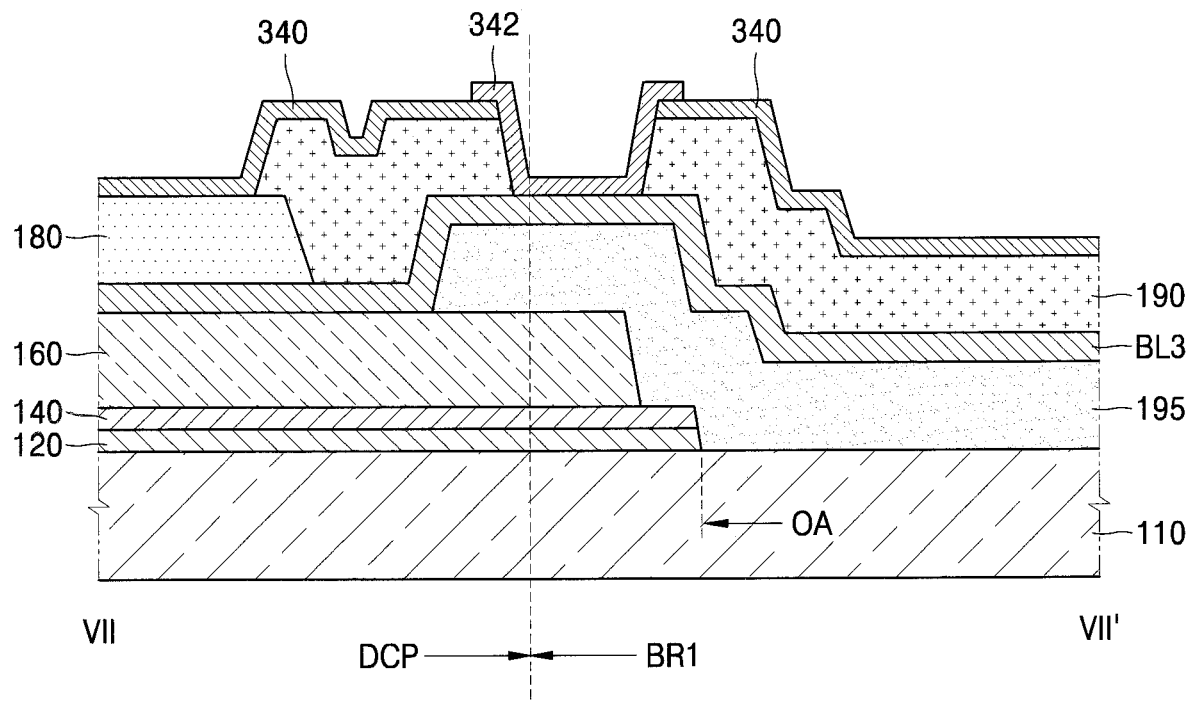
FIGS. 9-10 are cross-sectional views of portions of an organic light-emitting display apparatus according to another exemplary embodiment of the present disclosure.
Figure 10:
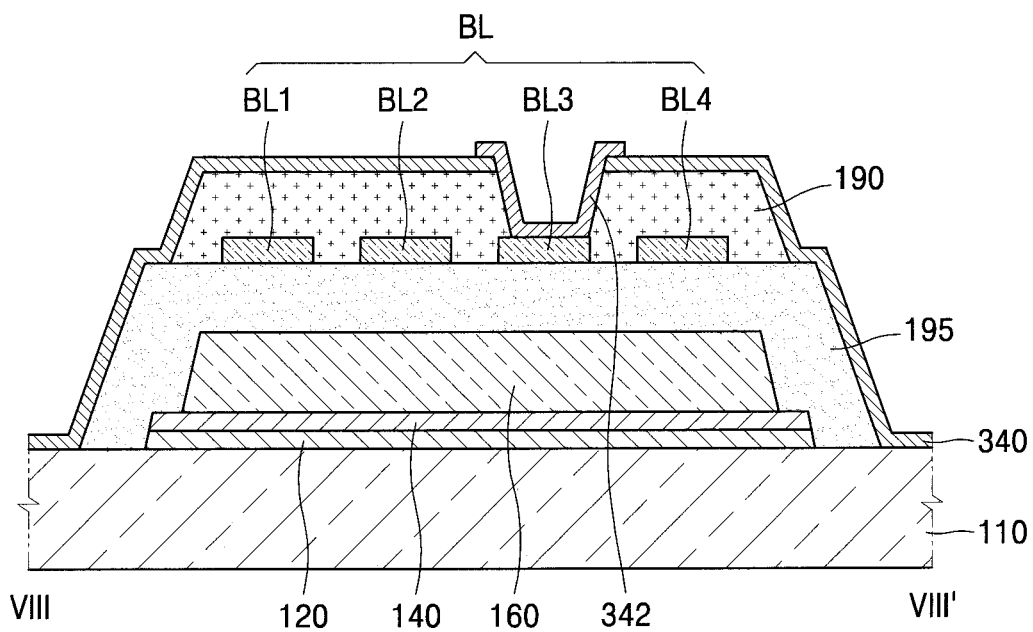

FIGS. 9 and 10 are cross-sectional views of portions of the organic light-emitting display apparatus according to another embodiment of the present disclosure. FIGS. 9 and 10 respectively correspond to FIGS. 7 and 8, which are cross-sectional views of the organic light-emitting display apparatus according to the previous embodiment.

Referring to FIGS. 9 and 10, the wires BL over the bridge BR may include the wire BL3 that may be the electrode power supply line ELVSS. An opening portion exposing at least a portion of a top surface of the wire BL3 is formed in the planarization layer 190 over the wire BL3, and a wire contacting portion 342 may be electrically connected to the wire BL3 through the opening portion. Also, the wire contacting portion 342 is electrically connected to the opposite electrode 340, thereby electrically connecting the opposite electrode 340 to the wire BL3. The wire contacting portion 342 is located over the bridge BR, and when desired, a portion of the wire contacting portion 342 may be located over the device counterpart DCP.

Figure 11:
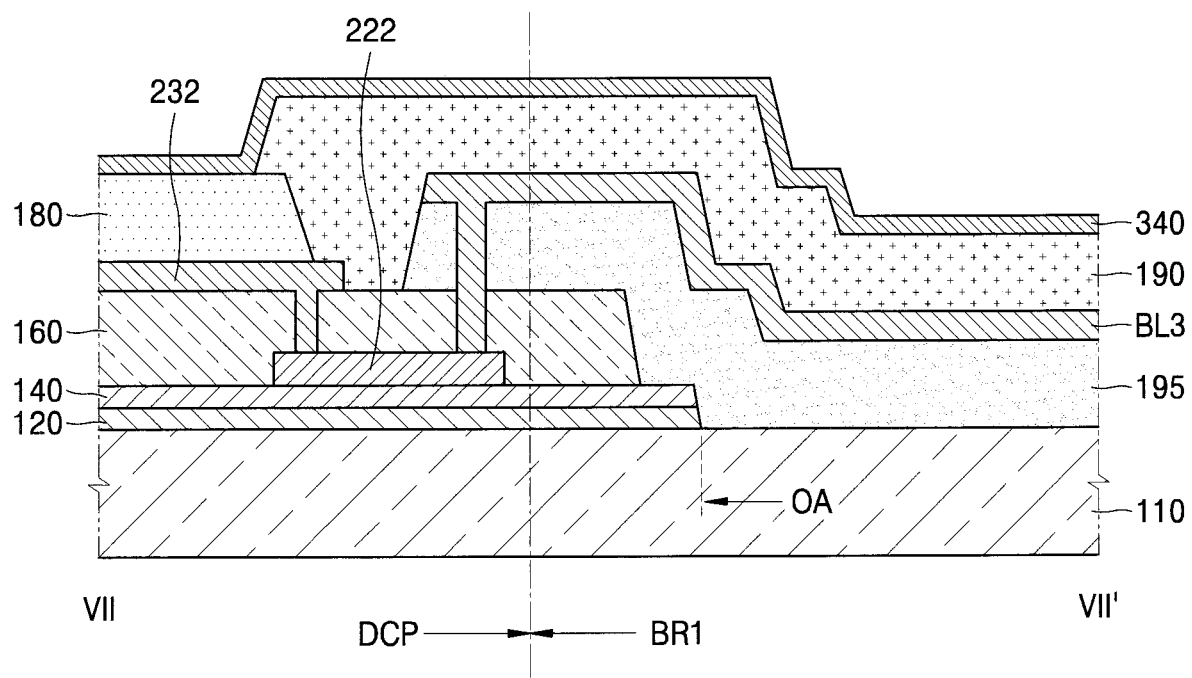
FIG. 11 is a cross-sectional view of a portion of an organic light-emitting display apparatus according to another exemplary embodiment of the present disclosure.

FIG. 11 is a cross-sectional view of a portion of the organic light-emitting display apparatus according to another embodiment of the present disclosure. FIG. 11 corresponds to FIG. 7 that is a cross-sectional view of the organic light-emitting display apparatus according to the previous embodiment.

In the previous embodiment described with reference to FIG. 7, the wires BL extend up to the interlayer insulating layer 160 through the organic layer 195; however, in the current embodiment, the wires BL may exist only over the organic layer 195. In FIG. 7, the wire BL3 is located only over the organic layer 195. In this case, a contact hole (i.e., a contact opening) exposing a portion of a gate wire 222 located over the gate insulating layer 140 may be formed over the organic layer 195 and the interlayer insulating layer 160, and the wire BL3 may be electrically connected to the gate wire 222 through the contact hole. The gate wire 222 may be formed of the same material and at the same time as the gate electrode 220.

In addition, a signal line 232 may be located over the interlayer insulating layer 160 over the device counterpart DCP, and may be electrically connected to the gate wire 222 through a contact hole formed over the interlayer insulating layer 160 and exposing a portion of the gate wire 222. For example, the signal line 232 over the device counterpart DCP may be electrically connected to the wire BL3 over the first bridge BR1 through the gate wire 222. For example, the signal line 232 may be a data line, and in this case, the wire BL3 may also be interpreted as a part of the data line. In this case, the signal line 232 may be formed of the same material and at the same time as the source or drain electrode 230 or 240.

However, the present disclosure may be variously modified in a suitable manner, and the signal line 232 may not be a portion of the data line, but may be a portion of a scan line or a portion of a power supply line.

Figure 12:
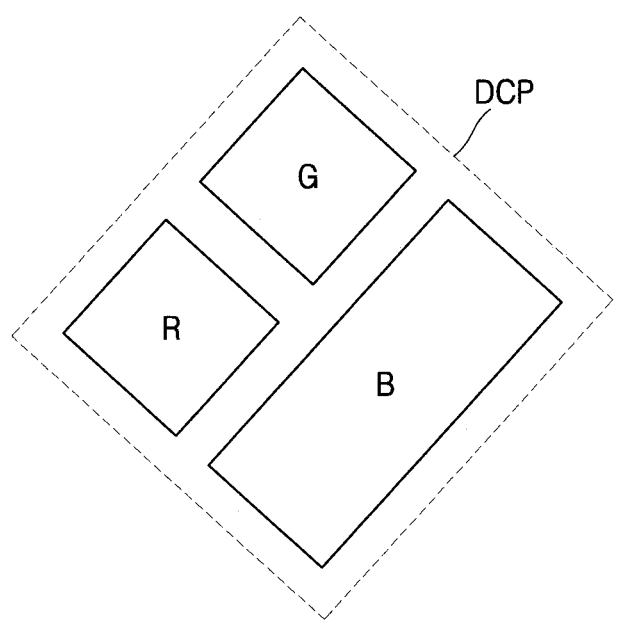
FIGS. 12-14 are plan views of arrangements of sub-pixels located over device counterparts in organic light-emitting display apparatuses, according to exemplary embodiments of the present disclosure.
Figure 13:
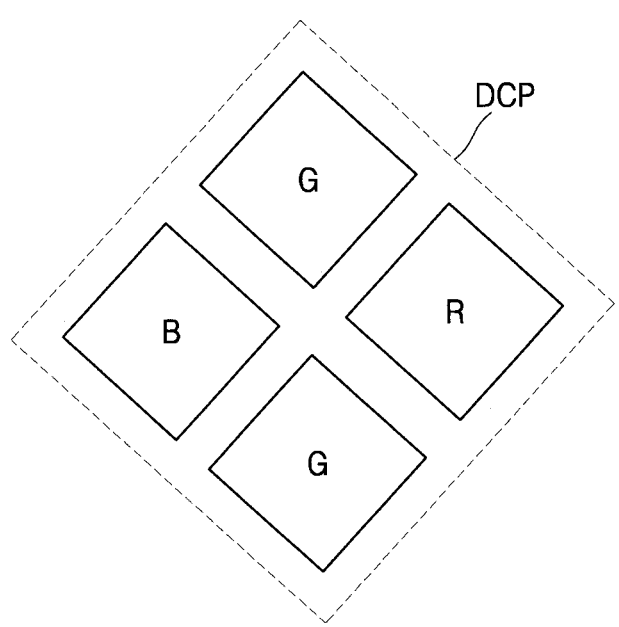
Figure 14:
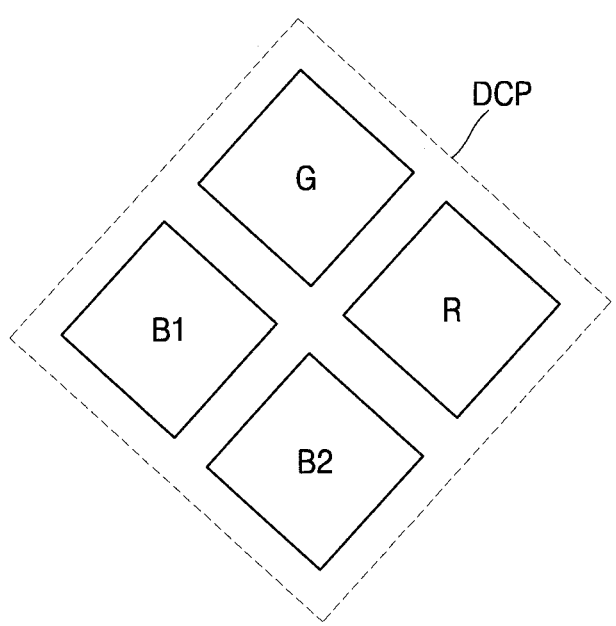

FIGS. 12 through 14 are plan views of arrangements of sub-pixels located over the device counterparts DCP in the organic light-emitting display apparatuses, according to some example embodiments of the present disclosure.

One sub-pixel may be located over one device counterpart DCP; however, embodiments of the present disclosure are not limited thereto and as shown in FIGS. 12 through 14, in some examples, a plurality of sub-pixels may be located over one device counterpart DCP. When the plurality of sub-pixels are located over one device counterpart DCP, the sub-pixels may form one pixel. For example, a display device set including a plurality of display devices may be located over one device counterpart DCP, wherein the display device set corresponds to a pixel.

In FIG. 12, a red sub-pixel R, a green sub-pixel G, and a blue sub-pixel B are located over the device counterpart DCP. In FIG. 13, one red sub-pixel R, one blue sub-pixel B, and two green sub-pixels G are located over the device counterpart DCP. Here, each of the two green sub-pixels G may be located between the red sub-pixel R and the blue sub-pixel B. In FIG. 14, one red sub-pixel R, one green sub-pixel G, a first blue sub-pixel B1, and a second blue sub-pixel B2 are located over the device counterpart DCP. Here, the first and second blue sub-pixels B1 and B2 may emit blue lights having different wavelengths.

In FIGS. 12 through 14, one pixel includes the red sub-pixel R, the green sub-pixel G, and the blue sub-pixel B; however, the present disclosure is not limited thereto. For example, a pixel may include a sub-pixel emitting light of a wavelength other than a red sub-pixel, a green sub-pixel, and/or a green sub-pixel. Also, the number of sub-pixels located over the device counterpart DCP may vary.

As shown in FIGS. 12 through 14, when the display device set including the plurality of display devices is located over the device counterpart DCP, each of the display devices may be an OLED. Also, an opposite electrode may be integrated throughout the plurality of display devices included in the display device set. In this case, the integrated opposite electrode may be in the form of an island corresponding to the device counterpart DCP where the display device set is located. Such an opposite electrode in the form of an island may be electrically connected to the wire BL3, that is, one of the wires BL, located over the first bridge BR1 as described above with reference to FIGS. 9 and 10. In this case, the wire BL3 may be understood as an electrode power supply line. Also, the encapsulation film 500 in the form of an island as described above with reference to FIG. 4 may correspond to the display device set including the plurality of display devices located over the device counterpart DCP. For example, one encapsulation film 500 in the form of an island may be arranged over the plurality of display devices included in one display device set.

Figure 15:
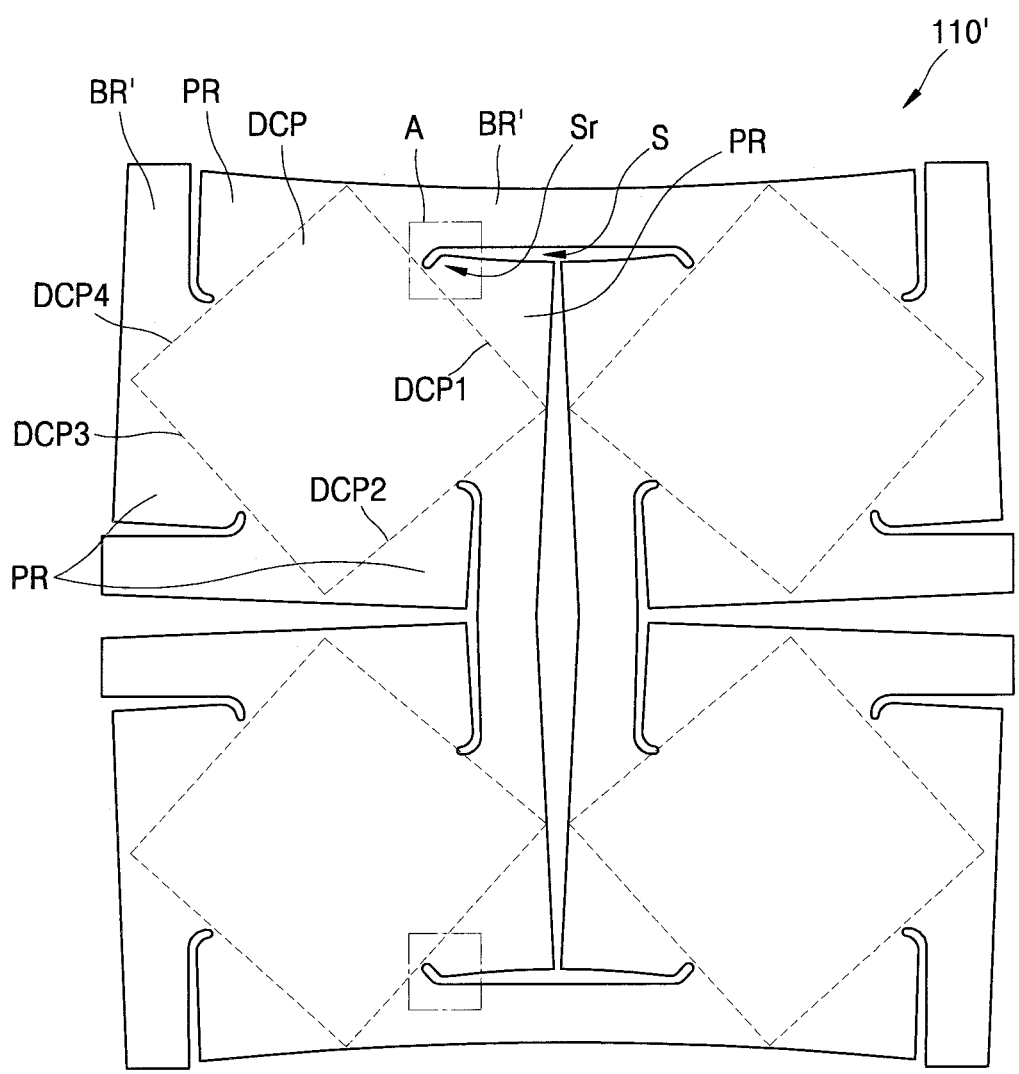
FIG. 15 is a plan view of a base layer of an organic light-emitting display apparatus, according to another exemplary embodiment of the present disclosure.
Figure 16:
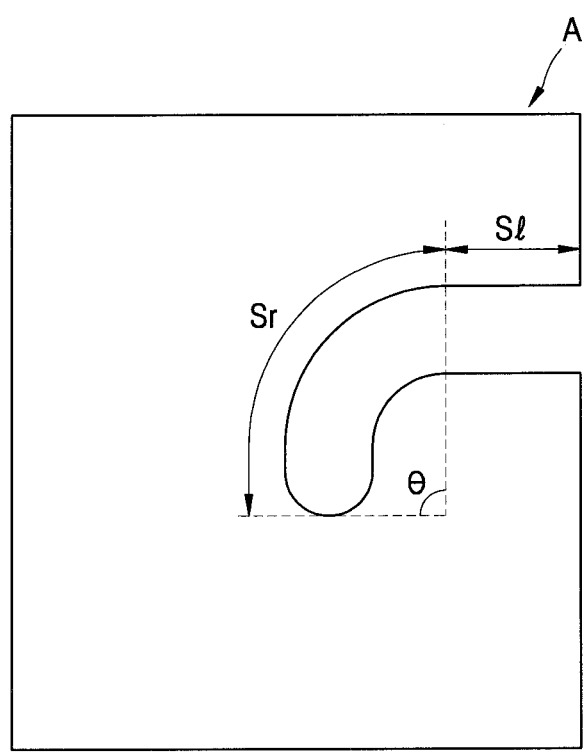
FIG. 16 is an enlarged plan view of the portion A of FIG. 15.

FIG. 15 is a plan view of a base layer 110' of an organic light-emitting display apparatus, according to another embodiment of the present disclosure. FIG. 16 is an enlarged plan view of the portion A of FIG. 15. FIG. 15 corresponds to FIG. 3 showing the plan view of the base layer 110 of the organic light-emitting display apparatus according to the previous embodiment.

Referring to FIG. 15, the base layer 110' according to the current embodiment further includes peripheral regions PR connected to the edges, that is, the first through fourth sides DCP1 through DCP4, of the device counterparts DCP, and slits S formed between the peripheral regions PR and bridges BR'. Each of the slits S may include a curved portion Sr located at an end of the slit S. In the organic light-emitting display apparatus according to the current embodiment, elongation may be adjusted by adjusting the thickness of the bridge BR', the length of the slit S, and/or the width of the slit S.

The slit S formed between the bridge BR' and the peripheral region PR may include a straight portion S$\ell$ and the curved portion Sr as shown in FIG. 16. The straight portion S$\ell$ may extend along one direction. The curved portion Sr may be located at one end of the straight portion S$\ell$, and may curve (e.g., bend) to have a pre-set radius of curvature. An angle θ between two ends of the curved portion Sr may change based on the radius of curvature of the curved portion Sr or the length of the curved portion Sr. When the substrate 100 is stretched, the bridge BR' is transformed, and at this time, a transformation rate of the bridge BR' may change based on the angle θ between the two ends of the curved portion Sr.

When the angle θ between the two ends of the curved portion Sr is changed, a largest transformation rate of the bridge BR', measured when the bridge BR' is stretched, varies. In detail, when the angle θ is 0° (when the slit S does not have a curved portion), a degree of largest transformation of the bridge BR' is high, that is, the bridge BR' is largely transformed. When the angle θ increases from about 0° to about 45', the degree of largest transformation of the bridge BR' decreases. When the angle θ increases from about 45° to about 90°, the degree of largest transformation of the bridge BR' is approximately constant.

When the degree of transformation of the bridge BR' increases, stress applied to structures including the wires BL located over the bridge BR' is increased; and on the other hand, when the degree of transformation of the bridge BR' decreases, stress applied to structures including the wires BL located over the bridge BR' is decreased. Accordingly, the slit S may include the curved portion Sr while the angle θ between the two ends of the curved portion Sr is between about 45° and about 90°.

According to one or more embodiments of the present disclosure, a display apparatus may be realized, in which a display device is prevented or substantially prevented from being damaged despite transformation of a substrate and light efficiency is increased.

It should be understood that embodiments described herein should be considered in a descriptive sense and not for purposes of limitation. Descriptions of features or aspects within each embodiment should typically be considered as available for other similar features or aspects in other embodiments.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The display apparatus and/or any other relevant devices or components, such as the scan driver, the data driver, and the timing controller according to embodiments of the present invention described herein may be implemented utilizing any suitable hardware, firmware (e.g. an application-specific integrated circuit), software, or a suitable combination of software, firmware, and hardware. For example, the various components of the display apparatus may be formed on one integrated circuit (IC) chip or on separate IC chips. Further, the various components of the display apparatus may be implemented on a flexible printed circuit film, a tape carrier package (TCP), a printed circuit board (PCB), or formed on a same substrate. Further, the various components of the display apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
a base layer comprising device counterparts and bridges, the bridges being located around the device counterparts and connecting the device counterparts to each other;
an inorganic insulating layer located over the base layer and having openings exposing at least a portion of at least one of the bridges;
organic layers filling the openings;
wires located over the organic layers;
display devices located over the device counterparts; and
encapsulation films each of which has a form of an island to correspond to a corresponding one of the device counterparts, each of the encapsulation films comprising:
a first inorganic encapsulation film covering a corresponding one of the display devices;
an organic encapsulation film located over the first inorganic encapsulation film; and
a second inorganic encapsulation film covering the organic encapsulation film and contacting the first inorganic encapsulation film outside of the organic encapsulation film.

2. The display apparatus of claim 1, wherein at least a portion of the organic encapsulation film has a convex lens shape.

3. The display apparatus of claim 1, wherein a surface of the first inorganic encapsulation film facing the organic encapsulation film is more hydrophobic than a surface of the second inorganic encapsulation film facing away from the first inorganic encapsulation film.

4. The display apparatus of claim 1, further comprising a hydrophobic coating layer arranged between the first inorganic encapsulation film and the organic encapsulation film.

5. The display apparatus of claim 1, wherein each of the device counterparts has a quadrangular shape, and a corresponding one of the bridges is connected to each side of each of the device counterparts.

6. The display apparatus of claim 5, wherein each of the bridges has a curved portion and the curved portion is adjacent to a corresponding one of the device counterparts.

7. The display apparatus of claim 6, wherein the curved portion has a uniform radius of curvature.

8. The display apparatus of claim 1, wherein the base layer further comprises peripheral regions connected to an edge of the device counterparts, and slits formed between the peripheral regions and the bridges.

9. The display apparatus of claim 8, wherein each of the slits comprises a curved portion.

10. The display apparatus of claim 1, further comprising thin-film transistors located over the device counterparts and electrically connected to the display devices, wherein the wires comprise a same material as a material comprised in source electrodes and drain electrodes of the thin-film transistors.

11. The display apparatus of claim 1, wherein the organic layers cover an edge of the inorganic insulating layer.

12. A display apparatus comprising:
a base layer comprising device counterparts and bridges, the bridges being located around the device counterparts and connecting the device counterparts to each other;
an inorganic insulating layer located over the base layer and having openings exposing at least a portion of at least one of the bridges;
organic layers filling the openings;
wires located over the organic layers;
display device sets located over a corresponding one of the device counterparts, wherein each of the display device sets comprises a plurality of display devices; and
encapsulation films each of which has a form of an island to correspond to a corresponding one of the device counterparts, each of the encapsulation films comprising:
a first inorganic encapsulation film covering a corresponding one of the display devices;
an organic encapsulation film located over the first inorganic encapsulation film; and
a second inorganic encapsulation film covering the organic encapsulation film and contacting the first inorganic encapsulation film outside of the organic encapsulation film.

13. The display apparatus of claim 12, wherein each of the plurality of display devices comprises an organic light-emitting device comprising:
a pixel electrode;
an intermediate layer located over the pixel electrode and comprising an emission layer; and
an opposite electrode located over the intermediate layer, and
wherein in the plurality of display devices comprised in one of the display device sets, opposite electrodes are integrated with one another to form a single opposite electrode having a form of an island corresponding to a corresponding one of the device counterparts.

14. The display apparatus of claim 13, wherein the opposite electrode is connected to at least one of the wires.

15. The display apparatus of claim 12, wherein the organic encapsulation film of each of the encapsulation films corresponds to corresponding one of the display device sets.

* * * * *